United States Patent [19]

Ekelund et al.

[11] Patent Number: 5,191,597
[45] Date of Patent: Mar. 2, 1993

[54] METHOD OF COMPENSATING FOR NON-LINEARITIES IN AN END AMPLIFIER INCORPORATED IN A RADIO TRANSMITTER

[75] Inventors: Björn O. P. Ekelund; Lars A. Jonsson, both of Lund, Sweden

[73] Assignee: Telefonaktiebolaget L M Ericsson, Stockholm, Sweden

[21] Appl. No.: 644,442

[22] Filed: Jan. 22, 1997

[30] Foreign Application Priority Data

Jan. 22, 1990 [SE] Sweden ................. 9000219

[51] Int. Cl.$^5$ ................................. H04L 27/36
[52] U.S. Cl. ........................ 375/60; 330/149
[58] Field of Search ............ 375/60, 58, 57, 52, 375/67, 39; 455/127, 126, 115; 332/107, 123, 124, 159, 176; 328/162; 330/75, 149

[56] References Cited

U.S. PATENT DOCUMENTS

| | | | |
|---|---|---|---|
| 4,229,821 | 10/1980 | de Jager et al. ............... | 375/53 |
| 4,412,337 | 10/1983 | Bickley et al. ................ | 375/60 |
| 4,565,980 | 1/1986 | Ashida ........................... | 375/60 X |
| 4,696,017 | 9/1987 | Masheff et al. ................ | 375/60 |
| 4,750,192 | 6/1988 | Dzung ........................... | 375/60 X |
| 4,787,094 | 11/1988 | Eguchi .......................... | 375/60 |

FOREIGN PATENT DOCUMENTS

| | | | |
|---|---|---|---|
| 0378719 | 7/1990 | European Pat. Off. ....... | 375/60 |
| 2304352 | 1/1972 | Fed. Rep. of Germany . | |
| 2469826 | 11/1979 | France . | |
| 7928052 | 11/1979 | France . | |
| 0048734 | 5/1981 | Japan ............................. | 375/60 |
| 2073516 | 3/1981 | United Kingdom . | |

Primary Examiner—Benedict V. Safourek
Attorney, Agent, or Firm—Burns, Doane, Swecker & Mathis

[57] ABSTRACT

A method for compensating for non-linearities in an end amplifier (F) having a given transfer function $H_R$, $H_\phi$ for amplitude and phase respectively and included in a radio transmitter of quadrature type for linear, digital modulation, and in which table look-up units (ST, CT) store the digital sine and cosine values ($I(t,\alpha)$, $Q(t,\alpha)$) of the quadrature components determined by a given signal vector $\alpha$. According to the method of values of the transfer functions $H_R$, $H_\phi$ for the quadrature modulated radio signals $r(t,\alpha)$ are calculated by addressing memory units (MH1, MH2) which store a number of values of $H_R$ and $H_\phi$. The sine and cosine values of the addressed values of $H_R$ and $H_\phi$ are also formed. The thus calculated values are multiplied by the stored digital values in the table look-up units (ST, CT) and by the inverted value of $H_R$. As a result, new modified values $i(t,\alpha)$, $q(t,\alpha)$ are obtained for the quadrature components, which compensates for the non-linearities in the final amplifier.

4 Claims, 3 Drawing Sheets

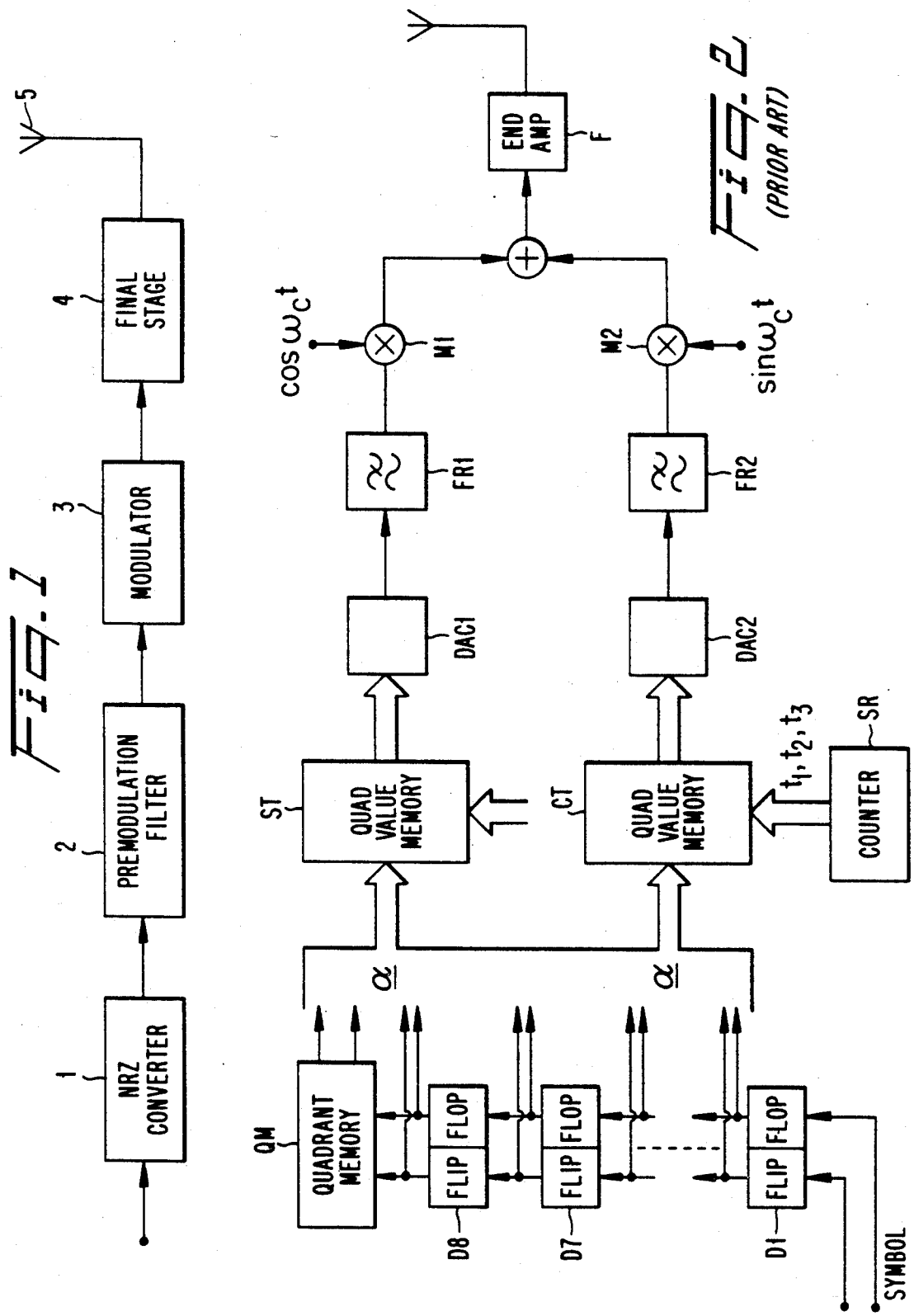

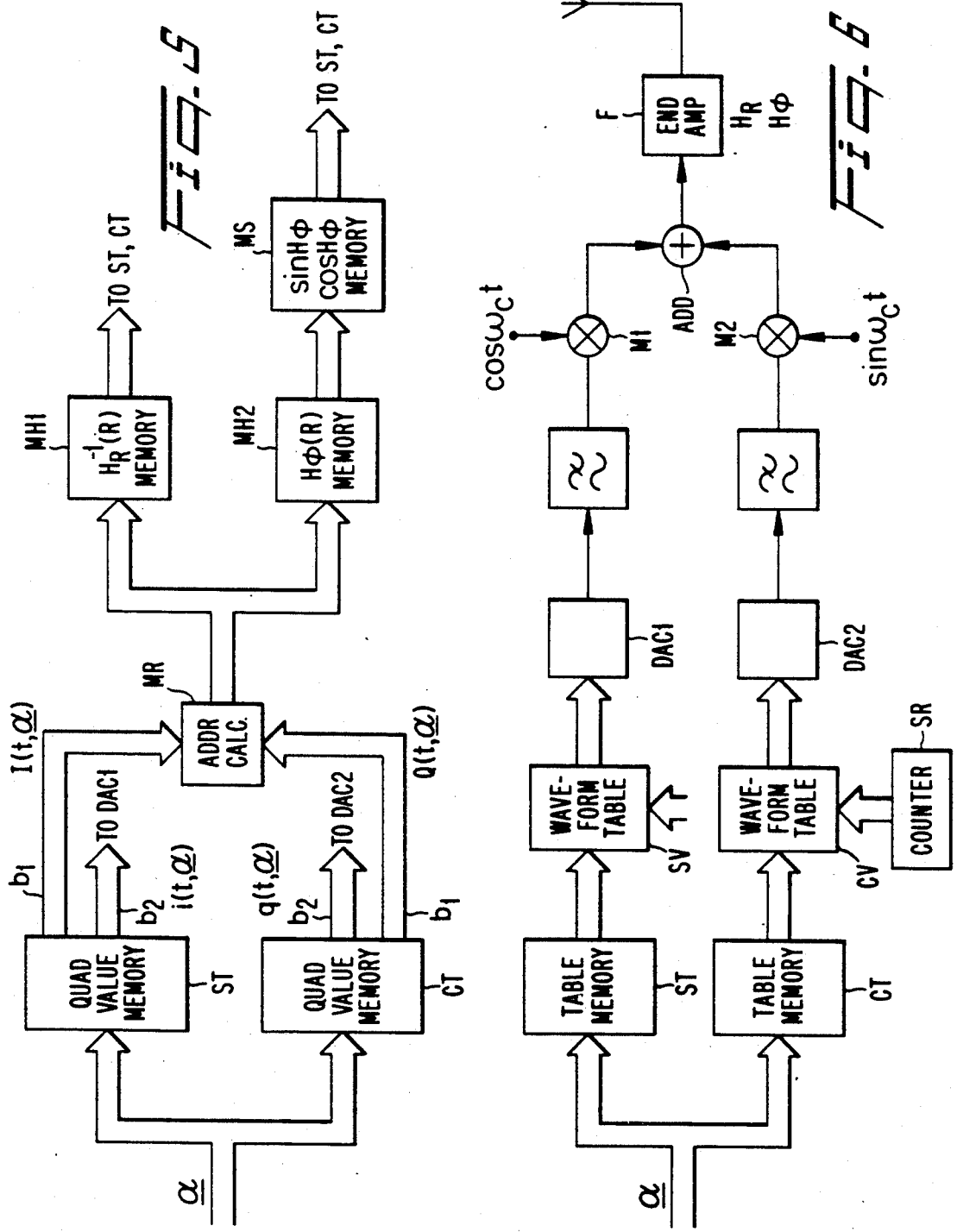

METHOD OF COMPENSATING FOR NON-LINEARITIES IN AN END AMPLIFIER INCORPORATED IN A RADIO TRANSMITTER

TECHNICAL FIELD

The present invention relates to a method of compensating for those non-linearities that occur in an end amplifier forming part of a radio transmitter which operates with linear, digital quadrature modulation. A radio transmitter of this kind is used, for instance, within mobile telephony in the mobile telephone part, for transmitting digitized speech, data and control information to a base station.

BACKGROUND ART

The radio transmitter of the mobile telephone in mobile telephony has a compact and space saving construction. The signal information (data, speech, control signals) to be transmitted are modulated on a carrier wave having a given angular frequency $w_c$. The modulation method applied is so-called quadrature modulation, i.e. the carrier wave is divided into two quadrature components, sine $w_c t$ and cos $w_c t$. These two components are then modulated with sine and cosine components of the information signal phase by, e.g., phase shift keying (QPSK). The information signal consists in a digital signal in the form of a bit flow of "ones" and "zeros". In the case of QPSK, a binary "one" corresponds to a given positive phase change or shift and a "zero" corresponds to a negative phase change or shift in the transmitted radio signal. The phase changes always start from the phase position of the preceding bit, so that subsequent to filtration the phase of the transmitted radio signal will have continuous progress in the absence of abrupt changes.

In order to form the radio signal r(t) to be transmitted, it is therefore necessary to form the sine and cosine values of a given phase angle (=phase change), these values being projected onto the two carrier wave components in the modulation process. These two values are called quadrature components and are normally designated I and Q respectively. It is known to use waveform generators which comprise memory stores in which these components are formed for a given phase change. For instance, U.S. Pat. No. 4,229,821 describes a waveform generator which contains two table look-up memories for each sine $\phi$ and cos $\phi$. These two memories are addressed by a signal vector $\phi$ with a given number of bits depending on the duration of the low-pass-filter impulse response (the impulse response of the premodulation filters) included in the tables. The duration of the impulse response is normally truncated to a given number of bits, this number depending on the required quality of the transmitted radio signal.

Downstream of the modulator circuits in the transmitter is a final amplifier which operates in amplifying the radio signal $r(t,a)$ to a given power for transmission from the transmitter antenna of the mobile telephone. Since the quadrature modulation applied is linear, i.e. the transmitted information influences both the amplitude and phase position of the radio signal, the amplification of the final amplifier must also be linear both with respect to amplitude and phase position.

DISCLOSURE OF THE INVENTION

The final stage of the transmitter, which normally consists of the end amplifier, operates in class C, i.e. its transistor circuits are biased so as to be located beneath the cut-off of the collector current when at rest. This means, however, that the quadrature components of an incoming signal will be distorted, because the amplifier does not operate within its linear range. Consequently, it is necessary to weigh the advantage of having the amplifier working within the class C region (high electric efficiency) against this disadvantage. The present invention utilizes the fact that the waveform generator includes the aforesaid table units for forming the quadrature components, i.e. the signal which is later to be amplified. It is possible to compensate for the non-linearity of the final amplifier, by modifying the digital values stored in the table units.

The inventive method is therewith characterized by the features set forth in the characterizing clause of the following claim 1.

BRIEF DESCRIPTION OF THE DRAWINGS

The present invention will now be described in more detail with reference to the accompanying drawings.

FIG. 1 is a block diagram of a theoretical model of a radio transmitter for digital modulation;

FIG. 2 is a block diagram of a known type of waveform generator in a radio transmitter and in which the proposed invention is applied;

FIG. 5 is a block diagram of a hardware solution according to the proposed method;

FIG. 6 is a block diagram illustrating another type of waveform generator to that shown in FIG. 3, where the proposed method can be applied.

DESCRIPTION OF THE PREFERRED EMBODIMENTS

Figure 3:
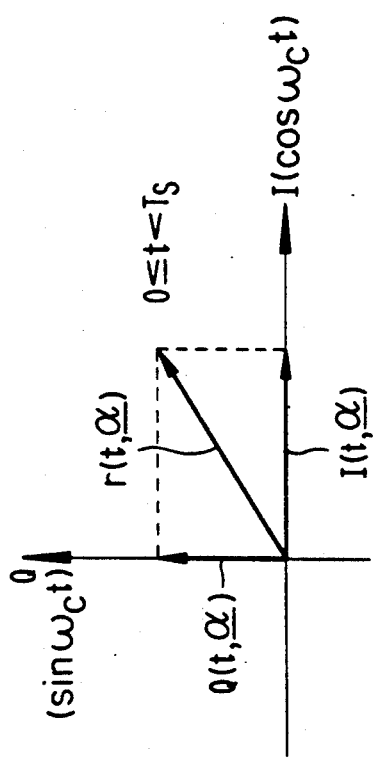
FIG. 3 is a diagram which illustrates the quadrature components of the phase position of a radio signal.

FIG. 1 is a simplified block diagram of a quadrature modulator. An incoming signal is applied to an NRZ-converter 1, so as to form a binary coded signal. A premodulation filter 2 of lowpass character produces an impulse response of given length, which is determined by the number of transmitted symbols which are to be stored in the subsequent quadrature modulator 3 at each moment in time. The modulator 3 is described below with reference to FIGS. 3 and 4. A final stage 4 is connected to the output of the quadrature modulator and to the input of the transmitted antenna 5, so as to give the radio signal sufficient power upstream of the antenna.

The modulator 3 is a so-called QPSK-modulator and utilizes the division of the signal into quadrature components. These components consist of the projections of the radio signal on two versions of an imaginary carrier wave sine $w_c t$ and cos $w_c t$ phase-shifted through 90°, where $w_c$ is the carrier angle frequency. The quadrature components or the quadrature signals have a lowpass character and constitute baseband signals.

In theory, QPSK has an infinite bandwidth. In practical applications, the modulation is always complemented with some form of prefiltration with the aid of the premodulation filter 2 illustrated in FIG. 1.

The traditional method of generating a QPSK-signal prior to dividing the signal into quadrature signals with subsequent modulation, is to apply the binary signals to an array of digital flip-flops and analogue filters. FIG. 2 illustrates a QPSK-generator with table look-up and a shift register whose length is equal to the number of bits (=two) used for QPSK. The shift register comprises a number of flip-flops D1-D8 equal to the number of symbols which are to be stored with respect to the impulse response of the premodulation filter. In the present case, each symbol consists of two bits and the number of symbols is equal to eight. The impulse response of the premodulation filter is thus truncated to a length which corresponds, in the present case, to the duration of eight symbols. The length of the impulse response is determined by the quality requirements placed on the generated radio signal. The shift register is terminated with an up-down counter QM which memorizes the output point of the waveforms of the symbol stored at that moment. This is necessary because the information is transferred by means of state transitions instead of absolute positions in the I-Q plane. Thus, during one symbol interval Ts the shift register D1-D8 and the memory counter QM store a signal vector $\alpha$ which consists of the symbol concerned and its nearest neighbour, and a value (in the counter QM) which denotes the starting point of the phase position.

FIG. 3 is a rotating vector diagram of an arbitrary radio signal $r(t,\alpha)$ which is to be transmitted with an absolute magnitude (amplitude) $R(t,\alpha)$ and a phase angle $\phi(t,\alpha)$. The radio signal is divided into two quadrature components $I(t,\alpha)$ and $Q(t,\alpha)$, which constitute "the projections" of the two carrierwave components $\cos w_c t$ and $\sin w_c t$ respectively of the carrierwave components and phase displaced through 90°. The quadrature components $I(t,\alpha)$ and $Q(t,\alpha)$ are stored in the table units ST and CT respectively in the modulator shown in FIG. 2, for all possible signal vectors $\alpha$. The following relationship applies for the radio signal $r(t,\alpha)$:

$$r(t,\alpha) = R(t,\alpha) \cdot \cos[w_c t + \phi(t,\alpha)]$$

where $$R(t,\alpha 2) = \sqrt{I^2(t,\alpha) + Q^2(t,\alpha)}$$

and $$\phi(t,\alpha) = \arg[I(t,\alpha) + j\, Q(t,\alpha)]$$

Figure 4A:
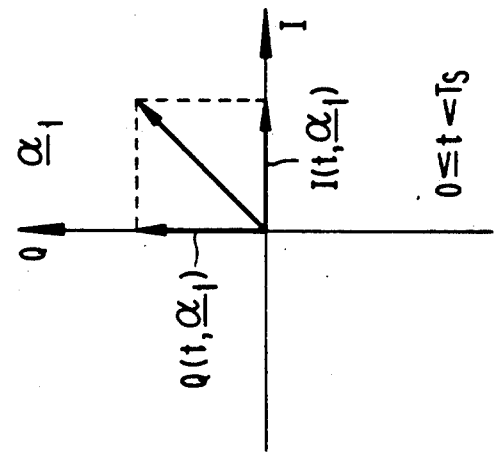
FIGS. 4a-4c illustrate the various positions of the quadrature components in a radio signal which varies in time.
Figure 4B:
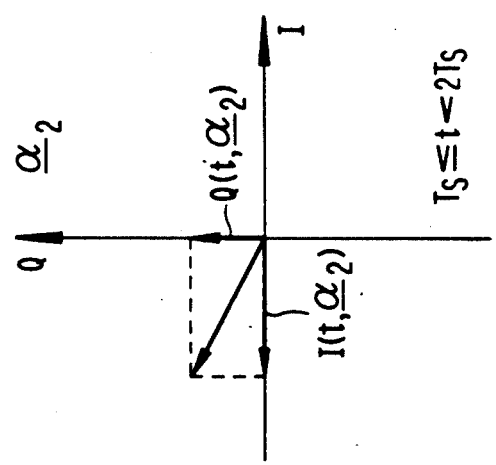
Figure 4C:
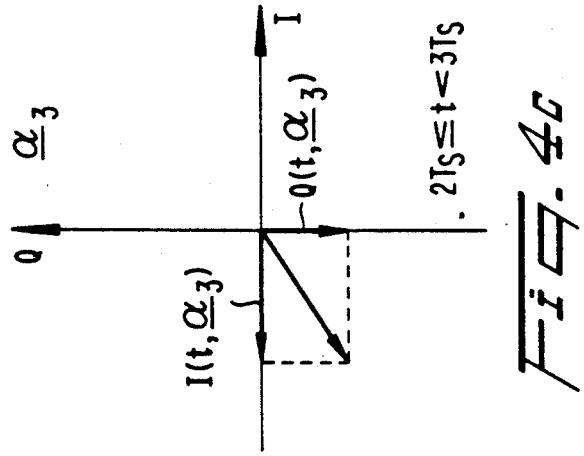

FIGS. 4a-4c illustrate three different radio signals $(r(t,\alpha)$ corresponding to three different signal vectors $\alpha_1$, $\alpha_2$ and $\alpha_3$, which are delivered from the shift register D1-D8 and the counter QM. Each of the signal vectors indicates the two quadrature components $I(t,\alpha)$ in the table units ST and CT. These components are stored respectively as a sine and cosine waveform in the table units. The waveform samples are brought forward in sequence with the aid of the counter SR, and the thus obtained digital values are applied to the digital-analogue converters DAC1, DAC2. The signals are then low-pass filtered in the filters FR1, FR2 prior to modulation of the carrier waveform components in the multipliers M1, M2 and addition in the summing circuit ADD.

If the impulse response $h_T$ of the premodulation filter is truncated to a given length $N_I \cdot T_s$, where $N_I$ is an integer and $T_s$ is the symbol time, and if the truncated impulse response has its centre at $t=0$ and a propagation from $-T_S N_I/2$ to $+T_S N_I/2$, the following expression is obtained for the quadrature components:

$$I(kT_s + t,\alpha) = \sum_{i=0}^{N_I-1} h_T\left(t + T_s \cdot \left[\frac{N_I}{2} 1 - i\right]\right) \cdot \cos\left(\frac{2\pi}{N} \cdot \alpha(i+k)\right)$$

$$Q(kT_s + t,\alpha) = \sum_{i=0}^{N_I-1} h_T\left(t + T_s \cdot \left[\frac{N_I}{2} 1 - i\right]\right) \cdot \sin\left(\frac{2\pi}{N} \cdot \alpha(i+k)\right)$$

It will be evident from the above formulae that $I(t,\alpha)$ and $Q(t,\alpha)$ are stored as cosine and sine waveforms respectively in respective table units ST and CT.

The aforedescribed modulation method is linear, i.e. the relationship between incoming signal vectors $\alpha$ and the output signals $I(t,\alpha)$ and $Q(t,\alpha)$ present a number of linear properties. This means, however, that the units included in the transmitter downstream of the table units must also be linear, in order to ensure that the relationship between incoming signal vectors and output signals will also be maintained, and thereby avoid impairing quality and disturbing other subscribers. The problem of obtaining a linear end amplifier F (FIG. 2) can occur in particular. The method proposed in accordance with the invention ignores the problem of linearizing the end amplifier and instead endeavours to compensate for this non-linearity in the table units ST and CT.

If the transmission function of the end amplifier is $H_R$ and $H_\phi$ for the input signal amplitude $R_1$ and its phase angle $\phi_1$, the following applies with respect to the output signal:

$$R_2 = H_R(R_1) \cdot R_1$$

$$\phi_2 = H_\phi(R1) + \phi_1$$

The inverse of $H_R$ and $H_\phi$ can be written as:

$$R_1 = H_R^{-1}(R_2) \cdot R_2$$

and $$\phi_1 = H_\phi^{-1}(R_2) + \phi_2$$

where $$H_R^{-1} = 1/H_R \text{ and } H_\phi^{-1} = -H_\phi$$

The inverse of $H_R^{-1}$ and $H_\phi^{-1}$ calculated by measuring a number of output signals $R_2$ for a given number of input signals $R_1$ and constitute static time-independent functions.

In order to obtain a correct output signal from the distorted end amplifier F, it is necessary to modify the contents of the look-up tables ST and CT according to FIG. 3 with $H_R^{-1}$ and $H_\phi^{-1}$. This is effected mathematically in accordance with the following relationship:

$$i(t,\alpha) = H_R^{-1}(R)[I(t,\alpha) \cdot \cos H_\phi(R) - Q(t,\alpha) \cdot \sin H_\phi(R)] \tag{1}$$

$$q(t,\alpha)=H_R^{-1}(R)[I(t,\alpha)\sin H_\phi(R)+Q(t,\alpha)\cos H_\phi(R)]$$

where $i(t,\alpha)$, $q(t,\alpha)$ are the modified waveform values which are intended to replace the original values $I(t,\alpha)$, $Q(t,\alpha)$.

Since $H_R$ and $H_\phi$ are statically time-independent functions, these functions can be stored in the tables ST and CT for the transfer function of a given final amplifier.

According to the aforegoing, the value of R of a given signal vector $\alpha$ can be calculated from the relationship:

$$R = \sqrt{I^2(t,\alpha) + Q^2(t,\alpha)} \quad (2)$$

since $I(t,\alpha)$ and $Q(t,\alpha)$ for the signal vector is stored in respective table units ST, CT. Thus, when R is known, $H_R$ and $H_\phi$ and therewith also $H_R^{-1}$ and $H_\phi^{-1}$ can be calculated. This enables the new coefficients in $i(t,\alpha)$ and $q(t,\alpha)$ for the signal vector $\alpha$ to be calculated from the relationship (1) above.

Thus, in the case of a given signal vector $\alpha_k$ whose waveforms are to be calculated, the various steps in modifying the content $I(t,\alpha)$ and $Q(t,\alpha)$ in respective table units ST and CT will be as follows:

1. Calculation of the amplitude R from the non-modified values $I(t,\alpha)$, $Q(t,\alpha)$ for the signal vector $\alpha_k$ according to relationship (2) above.

2. Calculation of the value of the transfer functions $H_R(R)$ and $H_\phi(R)$ for the value of R calculated according to step 1. The transfer functions $H_R(R)$ and $H_\phi(R)$ are calculated from measuring data and stored in respective units ST and CT.

3. Calculation of the new modified values $i(t,\alpha_k)$ and $q(t,\alpha_k)$ from the relationship (1) above. The new values are stored during the whole of the sampling interval $0 \leq < T_s$.

4. Sampling of the new values $i(t,\alpha_k)$, $q(t,\alpha_k)$ at the sampling time points $t_1, t_2, \ldots$ in a known manner during the symbol interval $0 \leq t < T_s$.

5. Transmission of the sampled digital values to the digital-analogue converters DAC1, DAC2 and further to remaining units according to FIG. 2.

6. New signal vectors $\alpha_{k+1}$ occur over the inputs to the table units ST, CT from the registers D1-D8 and the quadrant memory QM, steps 1-5 above being repeated.

FIG. 5 is a simplified block diagram which illustrates those memory and arithmetical units which effect modification of the quadrature components $I(t,\alpha)$, $Q(t,\alpha)$ stored in the table units ST and CT.

The non-modified (original) values of $I(t,\alpha)$ and $Q(t,\alpha)$ are obtained from an outgoing bus $b_1$ at a given sampling time point $t=t_1$. These values are delivered to a calculating unit MR which calculates the value $|r(t_1,\alpha)| = \sqrt{I(t_1,\alpha)^2 + Q(t_1,\alpha)^2} = R(t_1,\alpha)$.

This calculated value $R(t_1,\alpha)$ is caused to address two memory units MH1 and MH2. The memory unit MH1 stores a quantity of inverted values of the amplifying factor $H_R(R)$, i.e. $H_R^{-1}(R)$ for different input signals R to the end amplifier F. The values $H_R(R)$ can be obtained by carrying out measurements on the amplifier F and, according to the aforegoing, constitute a static, time-independent function of R. The memory unit MH2 stores corresponding values $H_\phi(R)$ of the phase characteristic of the end amplifier F, which similar to $H_R(R)$ is static and time-independent. The memories MH1, MH2 thus constitute static addressable ROM: S.

The addressed value of $H_\phi(R)$ in the memory unit MH2 is applied to a table unit MS which calculates sine $H_\phi(R)$ and cos $H_\phi(R)$. These two values are transferred to the table units ST and CT and are multiplied by the non-modified values $I(t_1,\alpha)$, $Q(t_1,\alpha)$ according to relationship (1) above. The value of $H_R^{-1}(R)$ is delivered to the memory unit MH1 at the same time and is multiplied by $I(t_1,\alpha)$, $Q(t_1,\alpha)$ according to (1).

When the next sampling takes place at $t=t_2$ (but for the same symbol vector $\alpha$) the unit MR is again addressed and calculates the modified values $i(t,\alpha)$, $q(t,\alpha)$, for $t=t_2$ in the manner described above. The values $i(t_1,\alpha)$, $q(t_1,\alpha)$ are, at the same time, delivered to the digital-analogue converters DAC1, DAC2 over the busses $b_2$.

The above method for compensating non-linearities can also be applied with a quadrature modulator of the configuration illustrated in FIG. 6. In this embodiment, the waveform generator tables have been divided into several part tables: One I-table and one Q-table of simplified form and two mutually identical waveform tables SV and CV. In this embodiment the coefficients in the tables ST and CT are modified in accordance with the method above described.

We claim:

1. In a digital quadrature-modulation radio transmitter comprising a premodulation filter for an incoming binary coded information signal to be transmitted, a modulator and a final amplifier, wherein the modulator includes: register means for storing binary values that form a signal vector whose length corresponds to an impulse response to said premodulation filter, and that represent momentary phase angles and accumulated phase angles of said information signal; means for addressably storing and retrieving digital values of unmodified quadrature values $I(t,\alpha)$, $Q(t,\alpha)$ addressed by said signal vector; means for converting digital quadrature values to analog quadrature values; means for multiplying the analog quadrature values by sine and cosine carrier wave components; and means for summing the multiplied analog quadrature values and carrier wave components to form a quadrature-modulated radio signal $r(t,\alpha)$, wherein the final amplifier has an amplitude transfer function $H_R$ and a phase transfer function $H_\phi$ and amplifies the quadrature-modulated radio signal $r(t,\alpha)$, a method of compensating in the modulator for non-linearities in the final amplifier comprising the steps of:

forming digital values $R(t,\alpha)$ which are absolute values of the quadrature modulated radio signal determined by said unmodified quadrature values $I(t,\alpha)$, $Q(t,\alpha)$;

retrieving, for successive values of said digital values $R(t,\alpha)$, first values $H_R(R)$ of the transfer function $H_R$ and second values $H_\phi(R)$ of the transfer function $H_\phi$;

storing, at respective addresses corresponding to the digital values $R(t,\alpha)$, said first and second values;

generating successive modified digital quadrature values $i(t,\alpha)$, $q(t,\alpha)$, each value representing a product of an inverse of a respective first value $H_R(R)$, multiplied by a sine and a cosine of a respective second value $H_\phi(R)$; and providing the successive modified digital quadrature values $i(t,\alpha)$, $q(t,\alpha)$ to the converting means instead of the unmodified digital quadrature values $I(t,\alpha)$, $Q(t,\alpha)$, wherein the absolute value of the modified digital quadrature values $i(t,\alpha)$, $q(t,\alpha)$ is $R(t,\alpha)$ divided by $H_R(R)$ and whereby the amplified quadrature-modulated radio signal produced from the modified digital quadrature values is compensated for the non-linearities of the final amplifier.

2. The method of claim 1, wherein the compensated digital quadrature values $i(t,\alpha)$ and $q(t,\alpha)$ are generated according to the following relationships:

$$i(t,\alpha) = H_R^{-1}(R)[I(t,\alpha)\cos(H_\phi(R)) - Q(t,\alpha)\sin(H_\phi(R))]$$

and $$q(t,\alpha) = H_R^{-1}(R)[I(t,\alpha)\sin(H_\phi(R)) + Q(t,\alpha)\cos(H_\phi(R))].$$

3. In a radio transmitter which operates with linear, digital quadrature modulation and has a premodulation filter having an impulse response $h(t)$, a method for compensating an information signal to be transmitted for non-linearities in a final amplifier having an amplitude transfer function $H_R$ and a phase transfer function $H_\phi$ comprising the steps of:

applying a plurality of binary values to an analog to digital converting shift register comprising an array of flip flops, the binary values forming a signal vector $\alpha$ of length dependent on the impulse response $h(t)$ and representing momentary phase angles and accumulated phase angles of the information signal;

storing the binary values in the shift register and storing values denoting starting phase angles in a memory counter;

retrieving unmodified digital quadrature values $I(t,\alpha)$, $Q(t,\alpha)$ from a memory, the unmodified digital quadrature values $I(t,\alpha)$, $Q(t,\alpha)$ being stored in the memory at addresses based on the signal vector $\alpha$;

successively calculating a value $R(t,\alpha)$ from successively retrieved unmodified digital quadrature values $I(t,\alpha)$, $Q(t,\alpha)$, each value $R(t,\alpha)$ being the absolute value of a quadrature-modulated radio signal $r(t,\alpha)$ that would be formed by modulating the carrier wave components $\cos(\omega_c t)$, $\sin(\omega_c t)$ with the respective retrieved predetermined digital quadrature values $I(t,\alpha)$, $Q(t,\alpha)$;

successively retrieving a first value $H_R(R)$ and a second value $H_\phi(R)$ from a memory containing a plurality of predetermined values of the transfer functions $H_R$ and $H_\phi$, the predetermined values of the transfer functions $H_R$ and $H_\phi$ being stored in the memory at addresses that are values $R(t,\alpha)$;

successively forming modified digital quadrature values $i(t,\alpha)$, $q(t,\alpha)$ by multiplying an inverse of a first value $H_R(R)$ by a sine and cosine of a second value $H_\phi(R)$ wherein the modified digital quadrature values have absolute values equal to the respective values $R(t,\alpha)$ multiplied by $1/H_R(R)$, whereby a quadrature-modulated radio signal $r(t,\alpha)$ formed by modulating the carrier wave components $\cos(\omega_c t)$, $\sin(\omega_c t)$ with the modified digital quadrature values $i(t,\alpha)$, $q(t,\alpha)$ is compensated for non-linearities of the final amplifier.

4. The method of claim 3, wherein the compensated digital quadrature values $i(t,\alpha)$ and $q(t,\alpha)$ are generated according to the following relationship:

$$i(t,\alpha) = H_R^{-1}(R)[I(t,\alpha)\cos(H_\phi(R)) - Q(t,\alpha)\sin(H_\phi(R))]$$

$$q(t,\alpha) = H_R^{-1}(R)[I(t,\alpha)\sin(H_\phi(R)) + Q(t,\alpha)\cos(H_\phi(R))].$$

* * * * *